United States Patent [19]

Dingwall

[11] Patent Number: 4,571,816
[45] Date of Patent: Feb. 25, 1986

[54] METHOD OF MAKING A CAPACITOR WITH STANDARD SELF-ALIGNED GATE PROCESS

[75] Inventor: Andrew G. F. Dingwall, Somerset County, N.J.

[73] Assignee: RCA Corporation, Princeton, N.J.

[21] Appl. No.: 680,524

[22] Filed: Dec. 11, 1984

[51] Int. Cl.[4] ............... H01L 21/94; H01L 27/02; H01L 29/92
[52] U.S. Cl. ............... 29/571; 29/577 C; 156/653; 357/23.6; 357/51; 148/DIG. 14; 148/DIG. 51
[58] Field of Search .............. 156/652, 653; 29/577 C, 29/571; 357/23.6, 51; 148/DIG. 14

[56] References Cited

U.S. PATENT DOCUMENTS

| 3,408,543 | 10/1968 | Ono et al. | 357/23.6 |
| 3,472,712 | 10/1966 | Bower | 148/187 |
| 3,891,190 | 6/1975 | Vadasz | 357/41 |
| 4,125,933 | 11/1978 | Baldwin et al. | 29/571 |
| 4,135,954 | 1/1979 | Chang et al. | 156/653 |
| 4,290,186 | 9/1981 | Klein et al. | 29/576 B |
| 4,377,029 | 3/1983 | Ozawa | 29/576 B |
| 4,413,401 | 11/1983 | Klein et al. | 29/571 |
| 4,511,911 | 4/1985 | Kenney | 357/23.6 |

Primary Examiner—Brian E. Hearn
Assistant Examiner—Tuan Quach
Attorney, Agent, or Firm—Birgit E. Morris; Donald S. Cohen; James M. Trygg

[57] ABSTRACT

A method of manufacturing a semiconductor device is disclosed wherein a matched capacitor having a relatively high capacitance is formed in the structure of a linear MOS device. The method utilizes the standard procedure for manufacturing MOS devices which includes two separate mask steps for forming contact openings to a field effect transistor. During the first mask step, the opening for the upper plate contact of the capacitor is fully etched while the opening for the lower plate contact is only partially etched. During the second mask step, the opening for the lower plate contact of the capacitor is fully etched to the lower plate. In this manner the existing standard procedure may be used without the addition of nonstandard mask and diffusion steps.

8 Claims, 8 Drawing Figures

METHOD OF MAKING A CAPACITOR WITH STANDARD SELF-ALIGNED GATE PROCESS

The present invention relates to MOS integrated circuit devices having integrally formed capacitors.

BACKGROUND OF THE INVENTION

One of the standard fabrication processes for making MOS integrated circuit devices utilizes a self-aligning gate process when forming the associated source and drain regions. This process, which is disclosed in U.S. Pat. No. 3,472,712 which issued Oct. 14, 1969 to Bower, includes the formation of a thin layer of electrically insulating gate oxide on the planar surface of a semiconductor body, the formation of a gate on the insulating material, and the selective implanting of a doping impurity thereby informing the source and drain regions using the gate itself as a mask. After forming the source and drain regions and adding a layer of nitride and a layer of borophosphosilicate glass (BPSG), a two step masking opeation is performed to form the contact openings. The first masking step forms openings through the BPSG. The second masking step extends the openings through the nitride and gate oxide layers so that the surface of the semiconductor body is exposed. The two step masking process is a standard one for many manufacturers because it greatly reduces the chance occurrence of a short due to the presence of foreign matter on the photolithographic plate during the masking process.

In self-aligning gate processes, there is no heavy doping under the gate. Therefore, a capacitor having a dielectric formed of this material is necessarily non-linear. In such processes where a capacitor is formed along with a transistor, the capacitor typically includes a lightly doped substrate electrode and an upper polysilicon electrode. Because the lightly doped substrate electrode can be depleted by the voltage on the upper polysilicon electrode, the capacitor is highly nonlinear and the effective electrical separation between the electrodes is not constant. This renders the capacitor unsuitable for precision measurement applications such as analog to digital converters.

When including a matched capacitor in the structure of a linear CMOS device of either the silicon on insulator(SOI) type, or bulk silicon type, the standard fabrication process must be modified to include an extra mask step and an extra diffusion. That is, the substrate electrode, or capacitor plate, must be heavily doped prior to forming the upper polysilicon electrode which is formed at the same time the gate is formed. On the other hand, when dealing with a CMOS device of the bulk silicon type, the standard fabrication process may be modified somewhat differently. In this case the two plates of the capacitor are formed of polysilicon and have a thin layer of oxide interposed between them. The structure is arranged on an area of isoplanar silicon dioxide. In this case the standard fabrication process must include an additional step to form a second layer of polysilicon and the associated photoresist mask.

What is needed is a method of forming a linear capacitor having high capacitance per unit area utilizing the standard fabrication process without the need for additional process steps. The present invention achieves this by taking advantage of the existing procedure whereby two separate mask steps are used to form the contact openings of the transistor.

SUMMARY OF THE INVENTION

According to the present invention a method of making a semiconductor capacitor device is provided comprising the following steps. A semiconducting region of one conductivity type is formed having a planar surface and a layer of dielectric material is formed on the planar surface. First and second spaced apart openings are formed partially through the layer of dielectric material over the semiconducting region. Then the second opening is extended completely through the remainder of the layer of dielectric material to expose a portion of the semiconducting region. An electrically conductive first electrode is formed in the first opening and an electrically conductive second electrode is formed in the second opening in ohmic contact with the exposed portion of the semiconducting region.

DESCRIPTION OF THE PREFERRED EMBODIMENT

In the following description and as shown in FIGS. 1 through 8, specific P and N type conductivity materials are indicated. These indications are by way of example and shall not be deemed to limit the teachings of the present invention. It will be understood that devices having opposite P and N arrangements are considered equivalent in all pertinent respects to the devices described herein.

Figure 1:
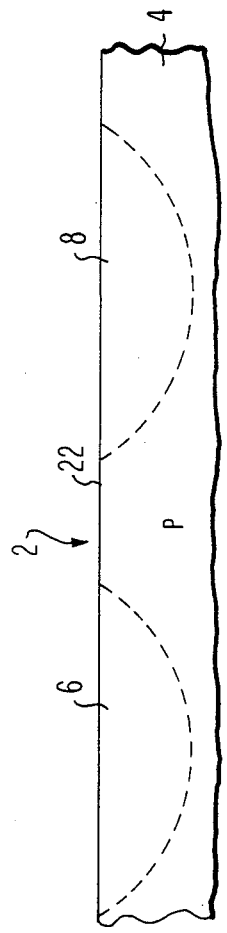
FIG. 1 is a cross sectional view of a portion of a substrate for an integrated circuit device.
Figure 2:
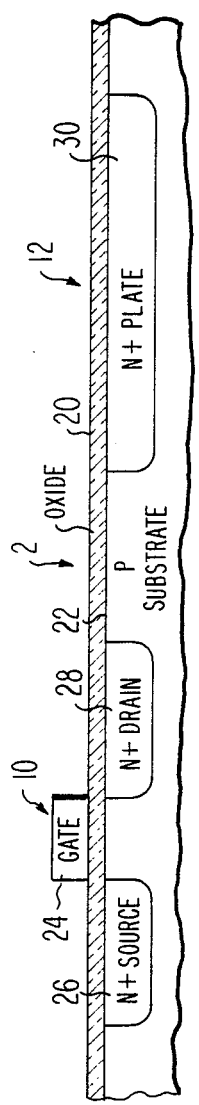
FIG. 2 is a view similar to that of FIG. 1 showing a partially completed transistor and capacitor of an integrated circuit device.
Figure 3:
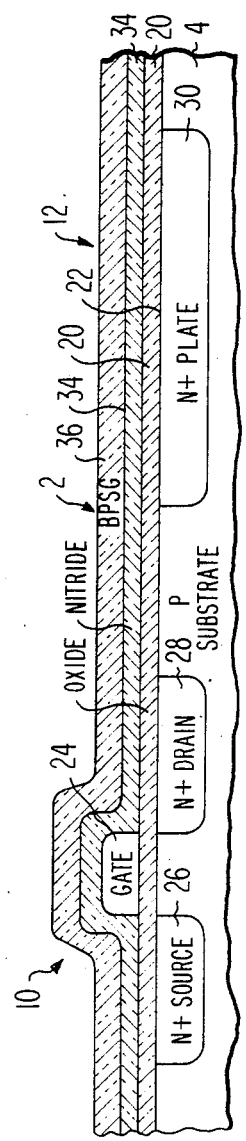
FIG. 3 is a view similar to that of FIG. 2 showing the device in a later stage of completion.

There is shown in FIGS. 1 through 6 an integrated circuit device 2 having a semiconductor body 4 of P type conductivity material. A pair of regions, indicated at 6 and 8 in FIG. 1, define the sites for forming a linear MOS transistor 10 and a matched capacitor 12 respectively. A relatively thin layer 30 of electrically insulating material, such as silicon oxide, is formed on a planar surface 22 of the body 4 as shown in FIG. 2. A gate 24 is then formed on the layer 20 and associated source and drain regions 26 and 28 respectively are formed utilizing the self aligning gate process referred to above. The forming of the layer 20, gate 24, source region 26, and drain region 28 is accomplished using processes that are well known by those skilled in the art and therefore will not be described here. Typically, the source and drain regions 26 and 28 are formed by ion implantation of suitable doping impurities to form the desired type conductivity material, which in the present case is N type conductivity. During the formation of the source and drain regions 26 and 28, a capacitor plate region 30 is also formed having N type conductivity. A layer 34 of silicon nitride is then formed on the entire device 2, as shown in FIG. 3. The combined thickness of the oxide layer 20 and nitride layer 34 is about 1800 angstroms, about 700 angstroms being the thickness of the oxide layer. A relatively thick layer 36, about 7000 angstroms, of BPSG is then formed over the nitride layer 34 in a manner that is well known in the art.

Figure 4:
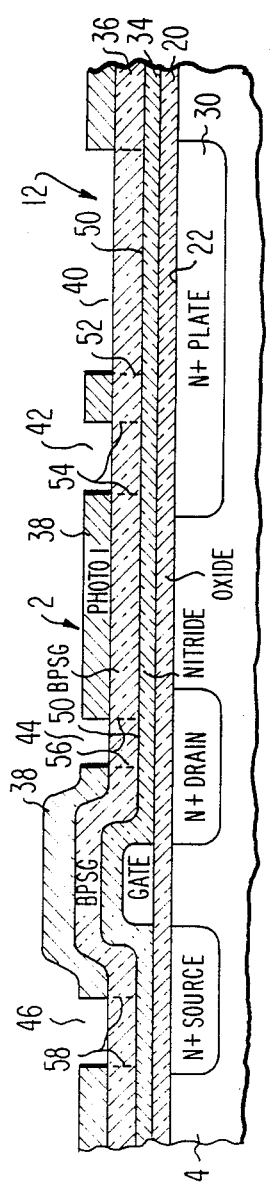
FIG. 4 is a view similar to that of FIG. 3 showing contact openings partially through the dielectric layer.

A first layer 38 of photoresist is formed over the layer 36 of BPSG and four openings 40, 42, 44, and 46 are formed in the layer 38 over the regions 26, 28, and 30 as shown in FIG. 4. The process for forming of the layer 38 and the openings 40, 42, 44 and 46 is well known in the art and, therefore, will not be described here. The device 2 is then subjected to reactive ion etching so that the portions of the layer 36 of BPSG that are exposed through the openings 40, 42, 44, and 46 are etched down to the surface 30 of the layer 34 of nitride, thereby leaving openings 52, 54, 56, and 58 in the layer 36 as indicated by dashed lines in FIG. 4. The layer 38 is removed in a manner that is well known in the art. The BPSG is then reflowed by subjecting it to about 900° C. in a nitrogen environment for about one half hour. This causes the BPSG layer 36 to take the form shown in FIG. 5.

Figure 5:
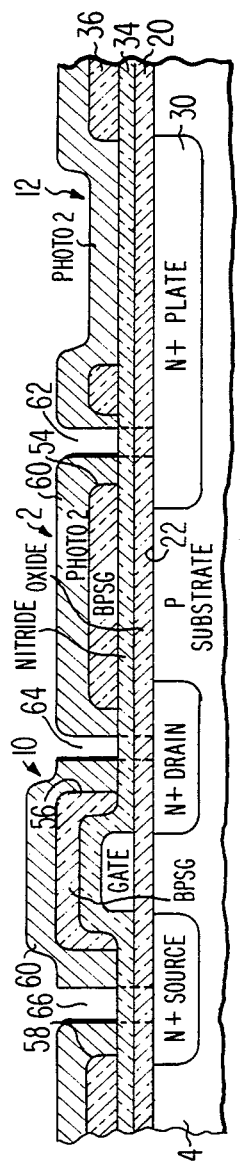
FIG. 5 is a view similar to that of FIG. 4 showing some of the contact openings completely through the dielectric layer.
Figure 6:
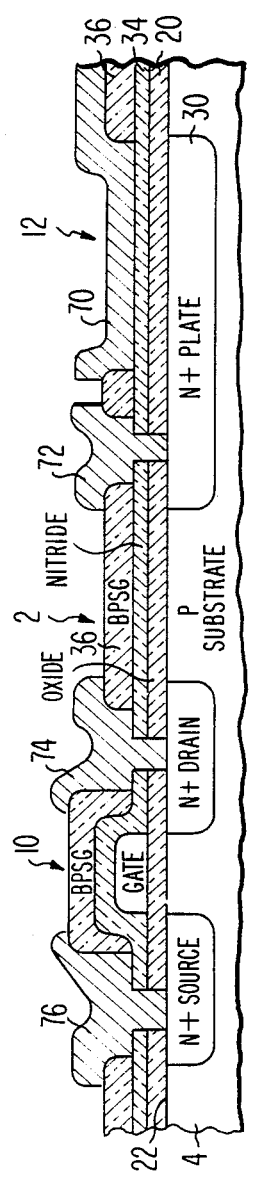
FIG. 6 is a view similar to that of FIG. 5 showing metal contacts in place.

A second layer 60 of photoresist is then formed over the layer 36 and the three openings 62, 64, and 66 are formed in the layer 60 within the openings 54, 56, and 58 respectively as shown in FIG. 5. The device 2 is again subjected to reactive ion etching so that the portions of the layers 34 and 20 that lie directly below the openings 62, 64, and 66 are etched down to the planar surface 22 as indicated by the dashed lines in FIG. 5. The second layer 60 of photoresist is then removed and the metal contacts 70, 72, 74, and 76 are formed in a manner well known in the art.

The metal contact 72 is in ohmic contact with the surface of the heavily doped region 30 which forms one plate of the capacitor 12. The metal contact 70, being in intimate contact with the nitride layer 34, forms the other plate of the capacitor 12. The layers 20 and 34 of oxide and nitride disposed between these two plates and having a combined thickness of about 1800 angstroms, form the dielectric of the capacitor 12. This structure yields a linear capacitor having a relatively high capacitance per unit area.

Figure 7:
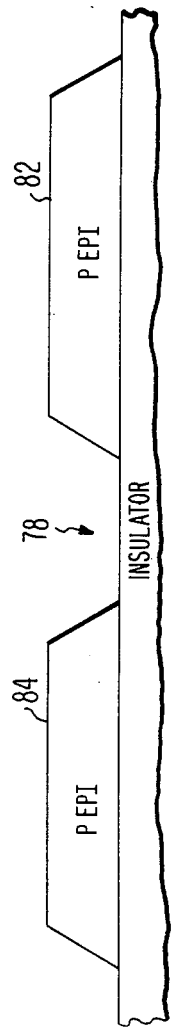
FIG. 7 is a cross sectional view of a partially completed integrated circuit device utilizing silicon on insulator structure.
Figure 8:
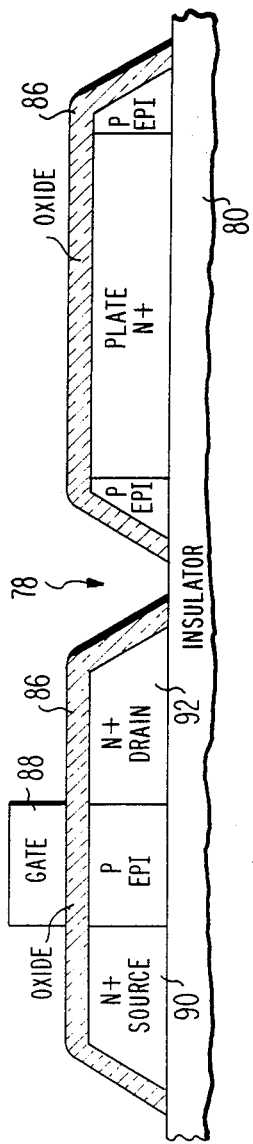
FIG. 8 is a view similar to that of FIG. 7 showing the device in a later stage of completion.

The above description pertains to forming a linear capacitor in the structure of the linear MOS device 2 wherein the substrate in bulk silicon. However, the same teachings may be applied to MOS devices of the silicon-on-insulator (SOI) type as well. Such as SOI structure 78 is depicted in FIGS. 7 and 8 where an insulator 80 is shown having two epitaxial layers 82 and 84 formed thereon which define the sites for forming a linear MOS transistor and a matching capacitor. The layers 82 and 84 are of P type conductivity material. A layer 86 of silicon oxide is formed over each of the layers 82 and 84 are shown in FIG. 8. A gate 88 is then formed on the layer 86 and associated source and drain regions 90 and 92 of N type conductivity are implanted or diffused in a manner similar to those of the bulk silicon device described above. During the formation of the source and drain regions 90 and 92, a capacitor plate region 94 is also formed having N type conductivity. A layer 34 of nitride and a layer 36 of BPSG are then formed over the entire device 78 in a manner similar to that described above for the bulk silicon device 2 and as depicted in FIGS. 3, 4, 5, and 6. Similarly, contact openings and contacts 70, 72, 74, and 76 are then formed. It will be understood that the manufacturing methods inherent in the structures shown in FIGS. 3, 4, 5, and 6 and described in relation to the device 2 may be applied to SOI devices as well as bulk silicon devices.

One of the very important advantages realized by practicing the teachings of the present invention is that a matched capacitor having a relatively high capacitance may be made in the structure of a linear MOS device using the standard fabrication process without the addition of nonstandard mask and diffusion steps.

I claim:

1. In a method of making a semiconductor capacitor device, the steps of:
   (a) forming a semiconducting region of one conductivity type having a planar surface;
   (b) forming a layer of dielectric material on said planar surface of said semiconducting region;
   (c) forming spaced apart first and second openings partially through said layer of dielectric material, said openings being disposed over said semiconducting region;
   (d) then extending said second opening completely through the remainder of said layer of dielectric material so that a portion of said semiconducting region is exposed;
   (e) forming an electrically conductive first electrode in said first opening; and
   (f) forming an electrically conductive second electrode in said second opening in ohmic contact with said portion of said semiconducting region.

2. The method set forth in claim 1 wherein said first opening has a substantially planar bottom and said first electrode is in contact with a substantial portion of said bottom.

3. The method set forth in claim 2 wherein said bottom of said first opening is over a major portion of said semiconducting region.

4. The method set forth in claim 3 wherein:
   step (b) of forming a layer of dielectric material includes forming individual layers of oxide, nitride, and borophosphosilicate glass;
   step (c) of forming spaced apart first and second openings through said layer of dielectric material includes forming said first and second openings through said individual layer of borophosphosilicate glass; and
   step (d) of extending said second opening includes extending said second opening completely through said individual layers of oxide and nitride.

5. In a method of forming an integrated circuit device the steps of:
   (a) providing first and second semiconducting regions of one conductivity type each of which has a planar surface;
   (b) forming a first layer of dielectric material on said planar surfaces of said first and second regions;
   (c) forming a gate on said first layer of dielectric material directly over said second region;
   (d) forming a plate region in said first region extending downwardly from said planar surface thereof and forming source and drain regions in said second region extending downwardly from said planar surface thereof on either side of said gate, said plate, source, and drain regions being of another conductivity type having a low resistivity relative to said one conductivity type;

(e) forming a second layer of dielectric material on said gate and on said first layer opposite said source, drain, and plate regions;

(f) concurrently forming spaced apart first, second, third, and fourth openings through a portion of said second layer of dielectric material, said first and second openings being disposed over said plate region, said third and fourth openings being disposed over said source and drain regions respectively;

(g) then extending said second, third, and fourth openings completely through the remainder of said second and first layers of dielectric material so that portions of said plate, drain, and source regions respectively are exposed;

(h) forming an electrically conductive first electrode in said first opening; and (i) forming electrically conductive second, third, and fourth electrodes in said second, third, and fourth openings respectively, in ohmic contact with said plate, drain, and source regions respectively.

6. The method set forth in claim 5 wherein said first opening has a substantially planar bottom and said first electrode is in contact with a substantial portion of said bottom.

7. The method set forth in claim 6 wherein said bottom of said first opening is over a major portion of said plate region.

8. The method set forth in claim 7 wherein step (e) of forming a second layer of dielectric material includes forming individual layers of nitride and borophosphosilicate glass.

* * * * *

UNITED STATES PATENT AND TRADEMARK OFFICE
CERTIFICATE OF CORRECTION

PATENT NO. : 4,571,816
DATED : February 25, 1986
INVENTOR(S) : Andrew G. F. Dingwall It is certified that error appears in the above-identified patent and that said Letters Patent is hereby corrected as shown below:

Column 1, line 22, "opeation" should be --operation--;

Column 2, line 55, "30" should be --20--;

Column 3, line 19, "30" should be --50--;

Column 3, line 52, "as" should be --an--; (2nd occurrence).

Column 3, line 59, "are" should be --as--;

Column 4, line 45, after "openings" insert --partially--.

Signed and Sealed this

Third Day of June 1986

[SEAL]

Attest:

Attesting Officer

DONALD J. QUIGG

Commissioner of Patents and Trademarks